United States Patent
Ning et al.

(10) Patent No.: US 9,236,301 B2
(45) Date of Patent: Jan. 12, 2016

(54) CUSTOMIZED ALLEVIATION OF STRESSES GENERATED BY THROUGH-SUBSTRATE VIA(S)

(71) Applicant: GLOBALFOUNDRIES Inc., Grand Cayman (KY)

(72) Inventors: Guoxiang Ning, Clifton Park, NY (US); Xiang Hu, Clifton Park, NY (US); Paul Ackmann, Gansevoort, NY (US); Sarasvathi Thangaraju, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 13/939,322

(22) Filed: Jul. 11, 2013

(65) Prior Publication Data
US 2015/0017803 A1 Jan. 15, 2015

(51) Int. Cl.
*H01L 21/44* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 2924/0002* (2013.01)

(58) Field of Classification Search
CPC ................................................ H01L 21/76898
USPC ......................................................... 438/667
See application file for complete search history.

(56) References Cited

U.S. PATENT DOCUMENTS

| 7,402,515 | B2 | 7/2008 | Arana et al. |
| 7,666,768 | B2 | 2/2010 | Raravikar et al. |
| 8,097,964 | B2 | 1/2012 | West et al. |
| 2006/0290002 | A1 | 12/2006 | Arana et al. |
| 2011/0147895 | A1 | 6/2011 | Bai et al. |
| 2012/0013022 | A1 | 1/2012 | Sabuncuoglu Tezcan et al. |
| 2012/0068313 | A1 | 3/2012 | Pagaila et al. |
| 2012/0292746 | A1 | 11/2012 | Lee et al. |
| 2013/0001793 | A1 | 1/2013 | Yu et al. |
| 2013/0140680 | A1* | 6/2013 | Harada et al. ................ 257/621 |
| 2014/0151090 | A1* | 6/2014 | Chien et al. .................. 174/250 |

OTHER PUBLICATIONS

Mercha et al., Comprehensive Analysis of the Impact of Single and Arrays of Through Silicon Vias Induced Stress on High-k/Metal Gate CMOS Performance, 2010 IEEE, IEDM10-26, pp. 2.2.1-2.2.-4.*

(Continued)

*Primary Examiner* — Reema Patel
*Assistant Examiner* — Syed Gheyas
(74) *Attorney, Agent, or Firm* — Heslin Rothenberg Farley & Mesiti P.C.; Nicholas Mesiti, Esq.

(57) ABSTRACT

Fabrication of through-substrate via (TSV) structures is facilitated by: forming at least one stress buffer within a substrate; forming a through-substrate via contact within the substrate, wherein the through-substrate via structure and the stress buffer(s) are disposed adjacent to or in contact with each other; and where the stress buffer(s) includes a configuration or is disposed at a location relative to the through-substrate via conductor, at least in part, according to whether the TSV structure is an isolated TSV structure, a chained TSV structure, or an arrayed TSV structure, to customize stress alleviation by the stress buffer(s) about the through-substrate via conductor based, at least in part, on the type of TSV structure.

17 Claims, 17 Drawing Sheets

(56) References Cited

OTHER PUBLICATIONS

A. Mercha et al., "Comprehensive Analysis of the Impact of Single and Arrays of Through Silicon Vias Induced Stress on High-k/Metal Gate CMOS Performance", Electron Devices Meeting (IEDM), 2010 IEEE International, Dec. 6-8, 2010, pp. 2.2.1-2.2.4, San Francisco.

H. Yu et al., "Package Interconnects", U.S. Appl. No. 13/171,478, filed Jun. 29, 2011, 79 pages.

H. Liu et al., "Through Silicon Via Device Having Low Stress, Thin Film Gaps and Methods for Forming the Same", U.S. Appl. No. 13/744,551, filed Jan. 18, 2013, 18 pages.

\* cited by examiner

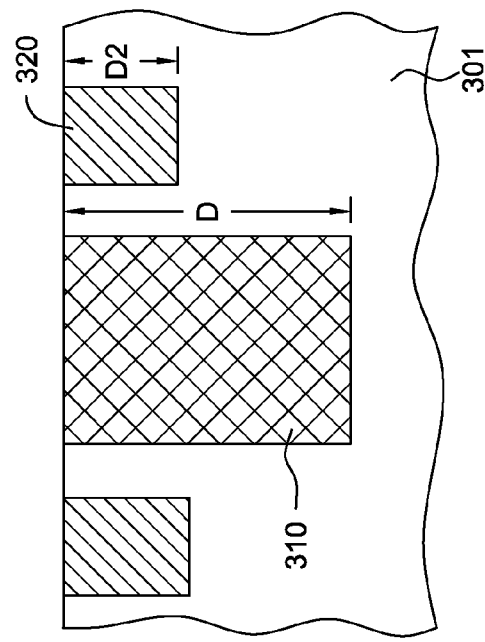
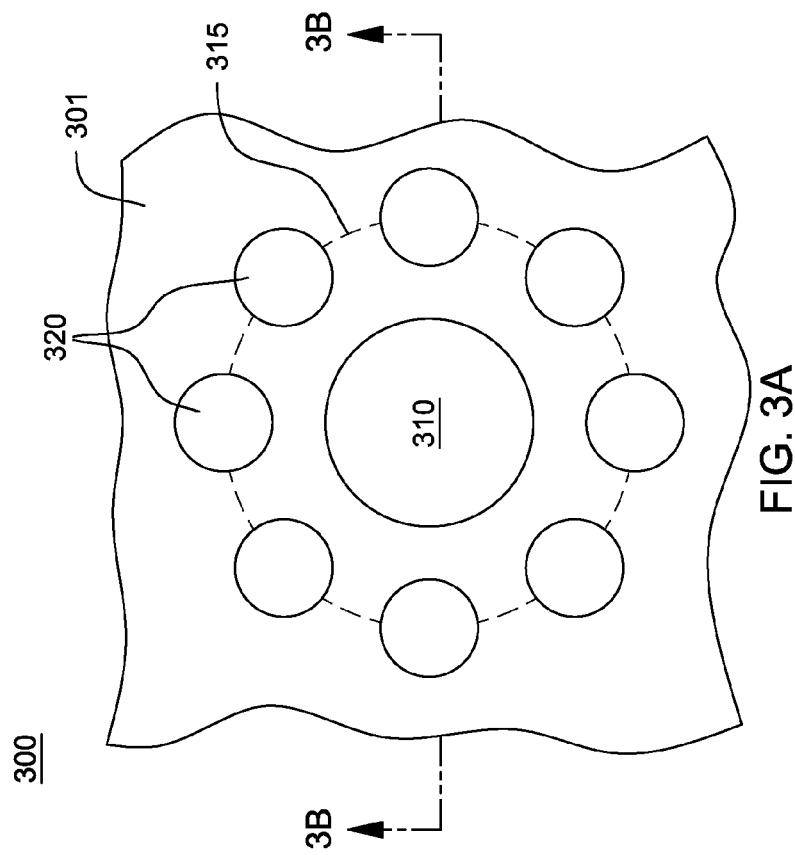
FIG. 3B
FIG. 3A

CUSTOMIZED ALLEVIATION OF STRESSES GENERATED BY THROUGH-SUBSTRATE VIA(S)

BACKGROUND

Wafer-level production has been proposed to stack wafers together to produce extremely dense electronic packages. Through-substrate via (TSV) (such as through-silicon via) processing is one of the techniques used in wafer-level packaging. It enables the production of small form factor devices, and the stacking of wafers to facilitate three-dimensional integration. Although TSV processing may provide higher reliability and less parasitic effects, the one or more through-substrate vias typically have a higher coefficient of thermal expansion (CTE) than the conventional wafer substrate, such as silicon. This CTE mismatch may result in significant stress in the substrate in the region of the through-substrate via, which may propagate outwards towards other devices. As such, TSVs may produce high stress, which may impact yield, and thereby increase costs.

BRIEF SUMMARY

The shortcomings of the prior art are overcome and additional advantages are provided through the provision, in one aspect, of a method which includes facilitating forming a through-substrate via (TSV) structure by: forming at least one stress buffer within a substrate; providing a through-substrate via conductor, wherein the through-substrate via conductor and the at least one stress buffer are disposed adjacent to or in contact with each other; and wherein forming the at least one stress buffer includes at least one of configuring or locating the at least one stress buffer relative to the through-substrate via conductor, at least in part, according to whether the through-substrate via structure is one of an isolated through-substrate via structure, a chained through-substrate via structure or an arrayed through-substrate via structure to customize stress alleviation by the at least one stress buffer about the through-substrate via conductor based, at least in part, thereon.

Additional features and advantages are realized through the techniques of the present invention. Other embodiments and aspects of the invention are also described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3A is a partial plan view of one embodiment of a through-substrate via (TSV) structure with multiple discrete stress buffers disposed adjacent to a TSV conductor, in accordance with one or more aspects of the present invention;

FIG. 3B depicts a cross-sectional elevational view of the TSV structure of FIG. 3A, taken along line 3B-3B thereof, in accordance with one or more aspects of the present invention;

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure. Note also that reference is made below to the drawings, which are not drawn to scale for ease of understanding, wherein the same or similar reference numbers used throughout different figures designate the same or similar components.

Various embodiments of the present invention are described hereinbelow with reference to the figures. These embodiments relate generally to devices, such as, for instance, semiconductor devices. For example, the semiconductor devices may include or be integrated circuits. In other embodiments, the devices may be other types of devices, such as micro-electromechanical (MEMs) devices. Embodiments may be employed to facilitate stacked devices, for example, multiple devices stacked together to form a device stack. The device stack may include semiconductor devices. The devices in the stack need not be the same type of device. In other embodiments, the device stack may be a hybrid stack which includes a semiconductor and MEMs device, by way of example. The devices may be incorporated into, for instance, CMOS products. The devices may also be incorporated into other types of products.

Figure 1:
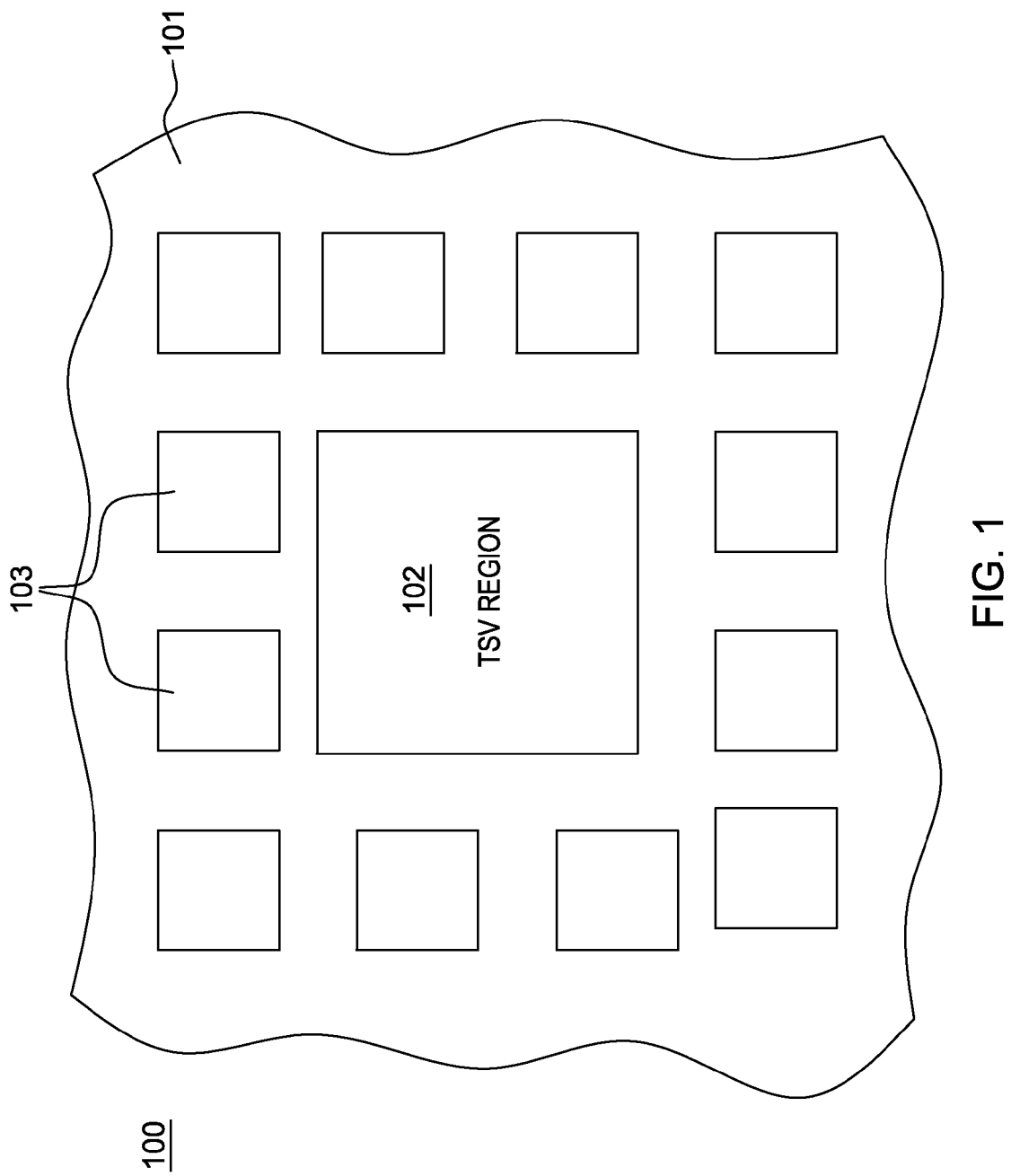
FIG. 1 is a partial plan view of one embodiment of a chip or wafer which includes a through-substrate via (TSV) region surrounded (in one example) by multiple components, in accordance with one or more aspects of the present invention.

By way of example, FIG. 1 depicts a partial view of a wafer 100, such as a semiconductor wafer. In one example, the semiconductor wafer may be a silicon wafer. Other types of wafers are also useful. For example, the wafer may be an n-type, p-type, silicon-on-insulator, or silicon germanium wafer. Depending on the type of device, the wafer may include or be a non-semiconductor material. The wafer may include an active surface 101, on or in which multiple components 103 are formed. In this example, components 103 are arrayed about the periphery of a through-substrate via (TSV) region 102. The multiple components 103 about the periphery of TSV region 102 may include, for instance, transistors, and TSV region 102 may include one or more through-substrate via (TSV) structures having one or more TSV conductors. A TSV conductor is, for instance, a conductive contact which upon completion of processing, extends from one major surface of the substrate to the other major surface. Other types of components may also be provided within the TSV region(s) 102. In another embodiment, the TSV region could surround one or more component regions. For instance, a TSV region could be a peripheral region of the device or wafer which surrounds the component or device regions. Other configurations of the TSV and component regions may also be useful.

One issue that may arise with a device or wafer configuration such as depicted in FIG. 1 is a potential coefficient of expansion mismatch between the TSV conductors within TSV region 102 and the surrounding substrate material. The thermal-mechanical stresses of a TSV conductor within a semiconductor substrate is three-dimensional in nature. Disclosed herein are various approaches to managing, reducing, or even eliminating impact of such thermal-mechanical stress on performance of any surrounding devices or components so as not to have a performance shift due to the presence of the TSV conductor within the substrate. In evaluating TSV-induced stress distribution within a substrate, it is noted that higher stress is typically distributed near the active surface, for instance, within 10 μm of the active surface of the device with a 100 μm TSV conductor.

In addition, it has been discovered that different types of TSV structure arrangements of TSV conductors within the TSV region produce different stress distributions in the XY plane. For instance, an isolated TSV structure has been found to have a different normal and shear stress distribution in the XY plane compared with that of a chained TSV structure having two or more TSV conductors closely disposed. Similarly, an arrayed TSV structure has been found to have different normal and shear stress distributions in the XY plane compared to that of the isolated TSV structure or the chained TSV structure. Thus, disclosed herein is the application of different stress buffering rules to different configurations of TSV conductors within the TSV region. In particular, the configuration, positioning, layout, etc., of certain low-stress buffers disclosed herein is based on an analysis of the stress distribution for the particular TSV conductor arrangement(s) within the TSV region, with the motivation being to minimize the thermal-mechanical stresses emanating from the TSV structures and regions so as not to unduly affect the performance of the surrounding components or devices.

Generally stated, disclosed herein is a method which includes facilitating forming a through-substrate via (TSV) structure so as to minimize thermal-mechanical stresses within the substrate due to the presence of one or more TSV conductors within the substrate. The facilitating forming of the TSV structure may include: forming at least one stress buffer within the substrate; providing a through-substrate via (TSV) conductor within the substrate, where the TSV conductor and the stress buffer(s) are disposed adjacent to or in contact with each other; and wherein forming the stress buffer(s) includes at least one of configuring or locating the stress buffer(s) relative to the through-substrate via conductor, at least in part, according to whether the TSV structure is an isolated TSV structure, a chained TSV structure, or an arrayed TSV structure, so as to customize stress alleviation by the stress buffer(s) about the TSV conductor based, at least in part, thereon. In one embodiment, forming the stress buffer(s) includes configuring and locating the stress buffer(s) differently about the TSV conductor, dependent upon whether the TSV structure is an isolated TSV structure, a chained TSV structure, or an arrayed TSV structure, and if the TSV structure is a chained TSV structure or an arrayed TSV structure, based on location of the TSV conductor therein. Numerous rules for configuring and positioning the low-stress buffers about the individual TSV conductors are depicted and described herein.

Figure 2:
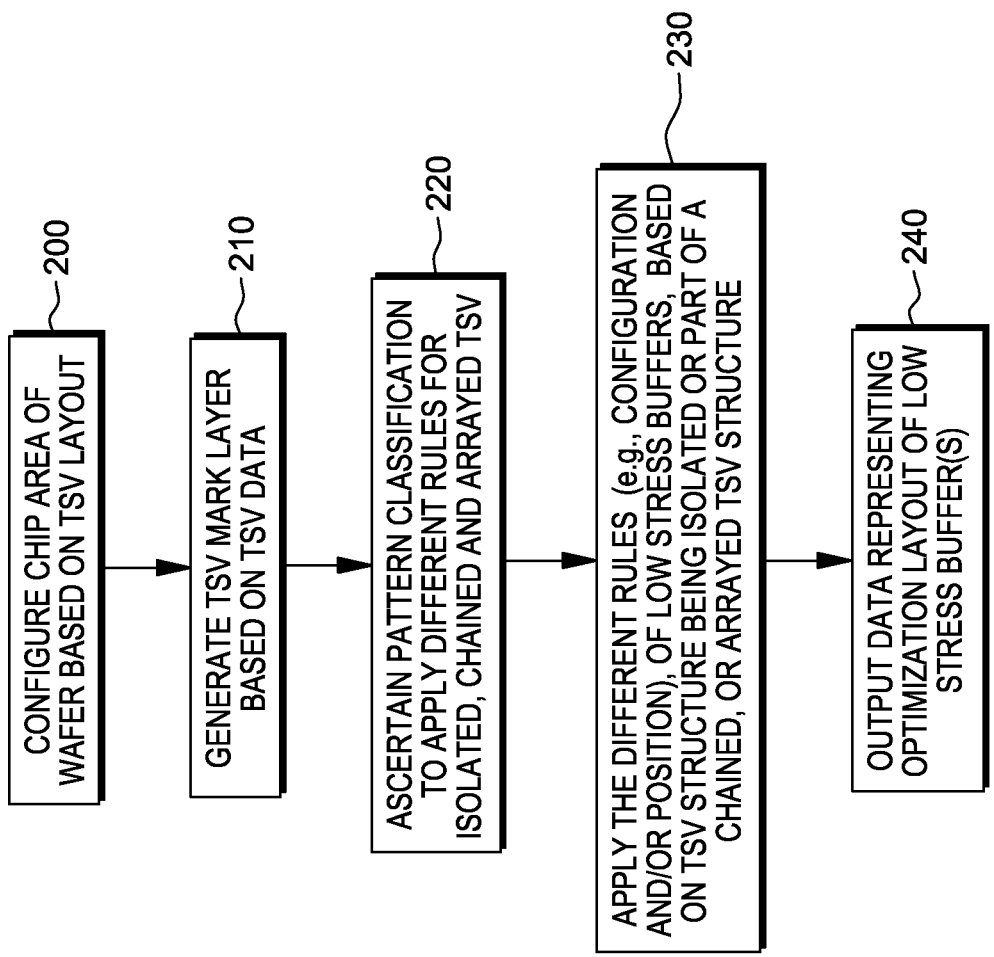
FIG. 2 depicts one embodiment of a process for facilitating forming a through-substrate via structure with at least one stress buffer and a through-substrate via conductor, in accordance with one or more aspects of the present invention.

FIG. 2 is an overview of one process for obtaining an optimized layout of low-stress buffers about an individual TSV conductor. The process begins with configuring the chip area of the wafer based on the TSV layout 200, which in one embodiment, includes determining whether TSV regions are to be placed within the device or wafer. The TSV mark layer may be generated based on the TSV data 210, and processing can automatically determine a pattern classification of the TSV structure(s) to apply different stress relief rules to the individual TSV conductors thereof based on whether the individual TSV conductors are isolated, or part of a chained or arrayed TSV structure 220. In one embodiment, the different rules define different configuration and/or positioning of the low-stress buffers, and again, these rules are applied based on the TSV structure being isolated, chained or arrayed 230. Note that, in one specific example, both the normal and shear stresses are addressed by the different rules applied according to the category of the TSV structure. Various examples of the different rule sets are described below with reference to the figures. Once obtained, the data representing the optimized layout for the low-stress buffer(s) is output for use in laying out and/or fabricating the low-stress buffers 240.

FIGS. 3A & 3B depict one embodiment of a TSV structure 300 having a TSV conductor 310 disposed within a substrate 301. By way of example, structure 300 is assumed to be an isolated TSV structure. In this embodiment, multiple discrete low-stress buffers 320 are arrayed (by way of example) about a common radius 315 so as to surround TSV conductor 310. As illustrated in FIG. 3B, in one embodiment, the depth (D) of TSV conductor 310 is substantially greater than the depth (D2) of stress-buffers 320 from (for instance) an upper surface of substrate 301 into the substrate. As one specific example, depth D2 of stress buffers 320 may be less than or equal to 15 μm, while depth (D) of TSV conductor 310 may be in the range of 100 μm or greater (when processing has been completed).

In one example, the substrate may include a semiconductor material, such as a crystalline material. For example, the substrate may include silicon. Other types of semiconductor materials, such as silicon-germanium (SiGe), germanium (Ge), gallium-arsenic (GaAs), or any other suitable semiconductor materials, including subsequently developed materials, may also be used as the substrate. The initial thickness of the substrate may be, for example, about 500 to 800 μm, and the substrate may be processed to have a final thickness of, for example, about 200 μm. In other embodiments, the final thickness of the substrate may be about 5-200 μm. Providing substrates with other thicknesses may also be useful. For example, the initial and final thicknesses may vary, depending on the methodology used and the depth of the TSV conductors which are formed. Further, the substrate may be a doped substrate. For example, the substrate may be a p-type or n-type doped substrate.

By way of example, TSV conductor 310 may include, for instance, a conductive material such as copper or a copper alloy. Other types of conductive materials, such as aluminum, tungsten, gold, silver, tin, other metals, or alloys thereof, may also be used to form the TSV conductor. Other types of materials, such as polysilicon, carbon nanotube, or a combination of materials, may also be used to form the TSV conductor. The diameter of the TSV conductor may range, for example, from about 1 to 10 μm. Providing TSV conductors having a diameter greater than 10 μm may also be useful. The depth of the TSV conductors may range, for example, from about 5 to 200 μm. Other depths of TSV conductors may also be useful. In one specific embodiment, the size of the TSV conductor is about 5 μm (diameter) by 50 μm (depth).

In one embodiment, stress buffers 320 are fabricated of a low stress film material and are disposed within the TSV region between identified TSV conductor sites or areas. The size of the TSV stress buffers may vary from, for instance, 100 nm to about 5 μm, depending on the size of the TSV conductors formed. Depth D2 is determined to be sufficient to alleviate stress caused by the CTE mismatch of the TSV conductor and the substrate materials. In one embodiment, the depth of the stress buffers is different from the depth of the TSV conductor(s). The depth of the stress buffers, for example, is less than the depth of the TSV conductor(s). In one embodiment, depth D2 is about 300 nm to 30 μm. Other widths and depths of the stress buffers may also be useful though.

The stress buffers alleviate stress created by the difference in coefficient of thermal expansion (CTE) between the TSV contact(s) and the substrate material. The material of the stress buffers should have a low elastic modulus, such as less than about 100 GPa, and low hardness to absorb the thermal stress caused by CTE mismatch of the TSV contact and substrate material. For example, materials such as polymer, plastic, organic or inorganic dielectrics, porous dielectric material (such as porous glass), or a combination of materials may be used for the stress buffers. Other types of materials may also be useful.

The particular configuration of low-stress buffers 320 depicted in FIGS. 3A & 3B represents one embodiment of a first rule or configuration designed to facilitate reducing both normal and shear stress emanating from TSV conductor 310. As explained herein, other configurations of stress buffers may also be employed, depending upon whether the individual TSV conductor at issue is part of an isolated TSV structure, a chained TSV structure, or an arrayed TSV structure. As presented herein, the different scenarios have different low-stress buffer configurations and positions so as to optimize stress reduction in each instance, without adding unnecessary cost. Note that in the embodiment of FIGS. 3A & 3B, the low-stress buffers 320 are configured by way of example as discrete low-stress buffers disposed in spaced relation a certain distance from the periphery of TSV conductor 310. In one fabrication implementation (discussed below with reference to FIGS. 4A-4E), the low-stress buffers 320 may be formed within the wafer or device first, followed by the TSV conductor(s).

Figure 3C:
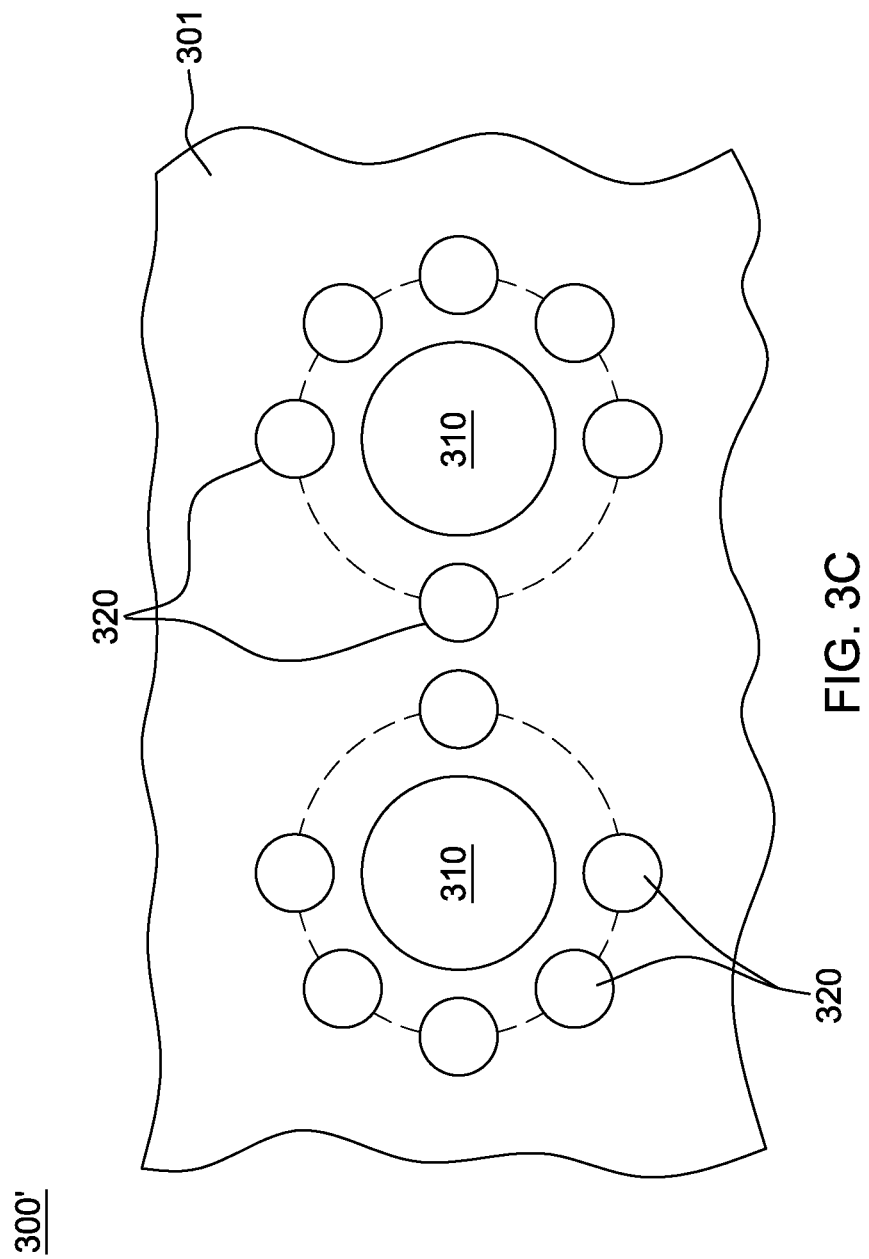
FIG. 3C is a top plan view of one embodiment of a chained TSV structure with multiple discrete stress buffers disposed about the individual TSV conductors thereof, in accordance with one or more aspects of the present invention.

FIG. 3C depicts one embodiment of a chained TSV structure 300' having two adjacent TSV conductors 310. Note that, in one implementation, TSV conductors are chained if they are disposed close enough to have their stress distributions combine or affect each other. In the embodiment illustrated, the particular layout of stress buffers 320 represents a predefined rule or configuration for stress buffer placement about the individual TSV conductors 310 of the chained TSV structure. In particular, because the individual TSV conductors are chained, certain stress buffers employed in the rule of FIG. 3A are able to be omitted as unnecessary to reducing stress in the substrate regions around the chained TSV structure. That is, there are certain zero coupling areas which have no need for the low-stress buffers. Note that in this configuration, the stress buffers 320 are again multiple discrete stress buffers positioned about the individual TSV conductors 310. These multiple stress buffers are partially uniformly spaced, and partially non-uniformly spaced about a particular TSV conductor (in one embodiment). By way of further example, the stress buffers may be disposed along a common radius out from the center of the adjacent TSV conductor.

Figure 3E:
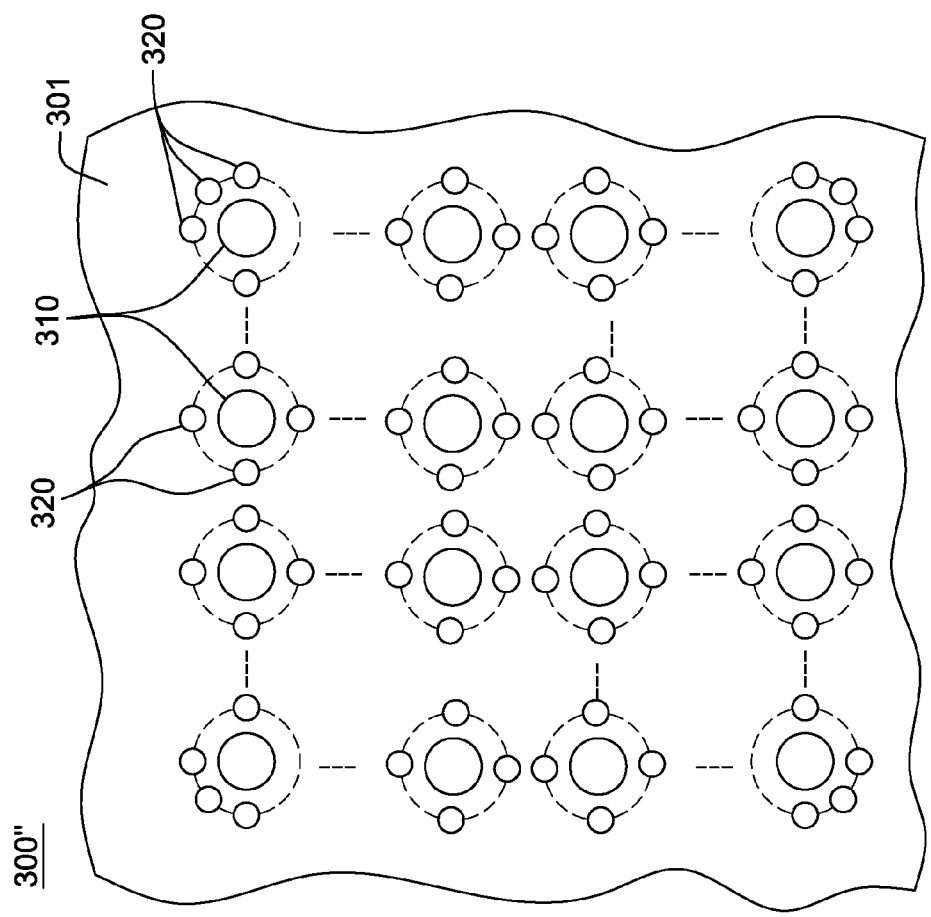
FIG. 3E depicts a variation on the structure of FIG. 3D, where the 2×2 arrayed TSV structure of FIG. 3D is expanded to an n×n arrayed TSV structure, in accordance with one or more aspects of the present invention.
Figure 3D:
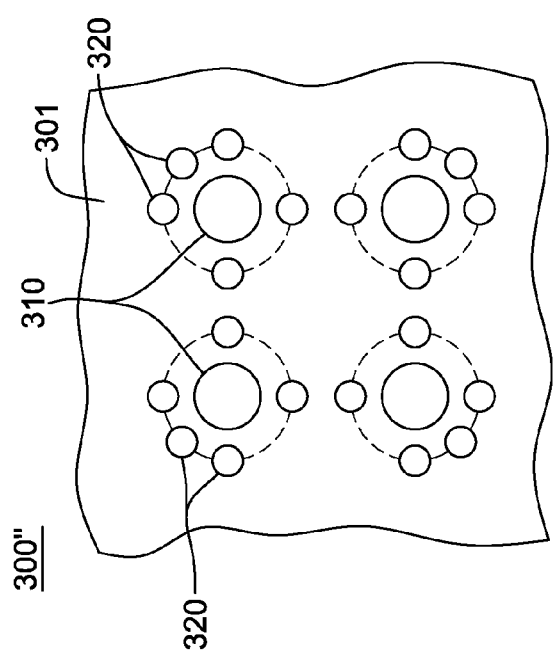
FIG. 3D is a partial plan view of one embodiment of a 2×2 arrayed TSV structure with four TSV conductors and multiple discrete stress buffers arrayed about the individual TSV conductors, in accordance with one or more aspects of the present invention.

FIGS. 3D & 3E depict alternate embodiments of an arrayed TSV structure 300", wherein the individual TSV conductors 310 form part of a 2×2 arrayed TSV structure or an n×n arrayed TSV structure, respectively. In both instances, additional stress buffers 320 may be omitted due to the way the stress distributions emanating from the individual TSV conductors couple in the arrays. For many of the TSV conductors in the array, shear stress is at a minimum or non-existent. For instance, the TSV conductors in the middle of the array may only need stress buffers disposed to facilitate reduction in normal stresses in the XY directions, as illustrated in FIG. 3E. Note also with reference to FIGS. 3D & 3E, that selected corner TSV conductors 310 have different configurations of stress buffers 320, where additional discrete stress buffers are added at 45° to reduce shear stress emanating from the corners of the arrayed TSV structures.

To summarize, the above-described rules or configurations of FIG. 3A, 3C, 3D or 3E, for laying out stress buffers are dependent on whether an individual TSV conductor is part of an isolated TSV structure, a chained TSV structure, or an arrayed TSV structure. These predefined rules or configurations are presented by way of example only, with numerous variations possible. Note also that the desired configuration, size, and layout of the stress buffers may be (in one example) predetermined for each of the different categories of TSV structures discussed.

Figure 3F:
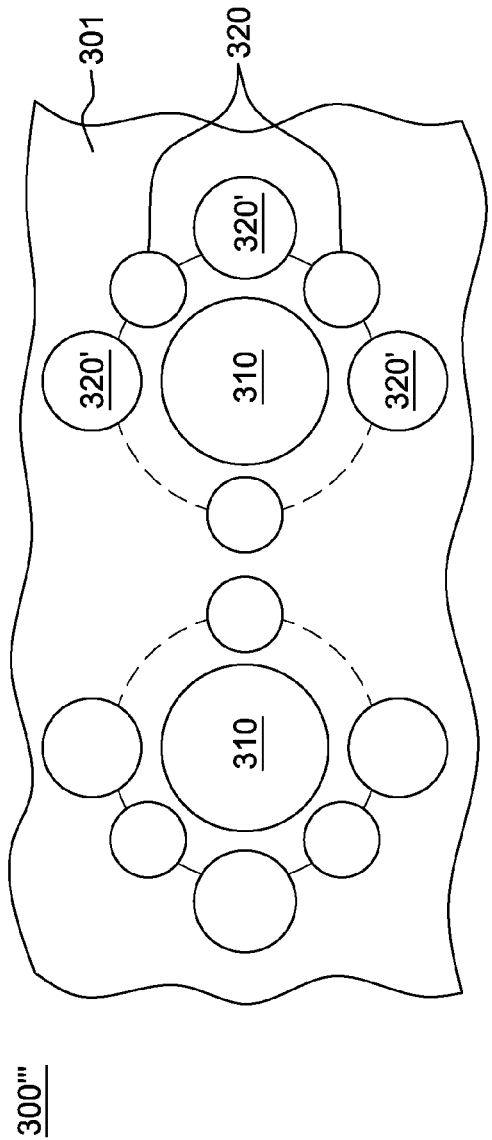
FIG. 3F depicts a partial plan view of a variation on the chained TSV structure of FIG. 3C, wherein selected stress buffers are differently sized or configured, compared to other stress buffers disposed about the individual TSV conductors within the chained TSV structure, in accordance with one or more aspects of the present invention.

By way of further example, FIG. 3F depicts a variation on the chained TSV structure of FIG. 3C, where selected stress buffers 320' are differently configured or sized from the remaining stress buffers 320 disposed about the individual TSV conductors 310 in the chained TSV structure 300'". The larger stress buffers 320' may be desired to, for example, further reduce normal stress emanating from the TSV conductor(s) 310 in the chained TSV structure arrangement of FIG. 3F.

Figure 3G:
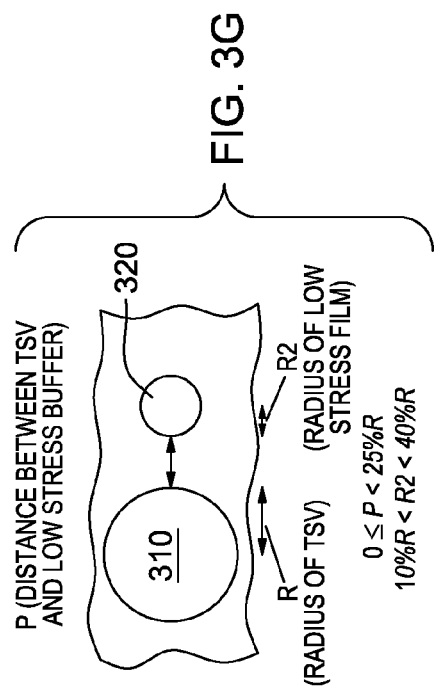
FIG. 3G is a partial plan view of an individual TSV conductor with a stress buffer disposed adjacent thereto in spaced relation, in accordance with one or more aspects of the present invention.

FIG. 3G depicts one example of relative distances and proportions of a TSV conductor in comparison to a stress buffer. As shown, the distance (P) between the TSV conductor 310 and the discrete low-stress buffer 320 may be, for instance, between zero and 25% of the radius (R) of TSV conductor 310. By way of further example, the radius (R2) of stress buffer 320 may be in the range between 10% and 40% of the radius (R) of TSV conductor 310. Other distances and radii may be useful, depending upon a particular stress distribution about a TSV structure.

As can be seen from FIGS. 3A-3F, in one or more aspects, facilitating forming a through-substrate via structure includes defining a first configuration of stress buffers arranged about a through-substrate via conductor where the through-substrate via conductor is part of an isolated through-substrate via structure (such as depicted in FIG. 3A), a second configuration of stress buffers arranged about the through-substrate via conductor where the through-substrate via conductor is part of a chained through-substrate via structure (such as shown in FIG. 3C), and a third configuration of stress buffers arranged about the through-substrate via conductor where the through-substrate via conductor is part of an arrayed through-substrate via structure (such as depicted in FIGS. 3D & 3E). Note that the first configuration, second configuration, and the third configuration are, in one or more implementations, related in that the second configuration is the same as the first configuration, less one or more stress buffers of the first configuration, and the third configuration is the same as the second configuration, less one or more stress buffers of the second configuration, as depicted in FIGS. 3A-3E.

Figure 4C:
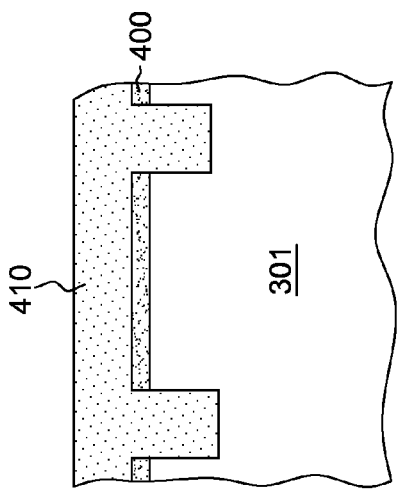
FIGS. 4A-4E depict one embodiment of a process for fabricating a through-substrate via structure such as depicted in FIGS. 3A-3F, in accordance with one or more aspects of the present invention.
Figure 4B:
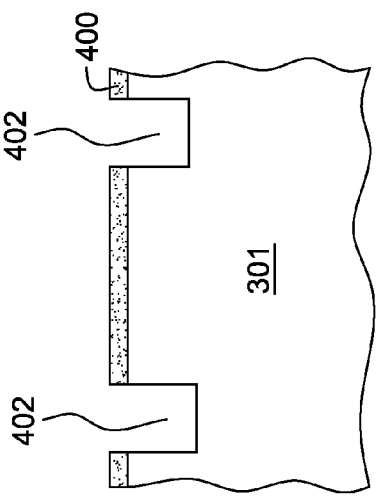
Figure 4A:
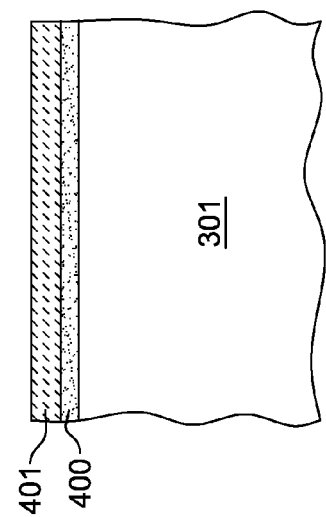
Figure 4E:
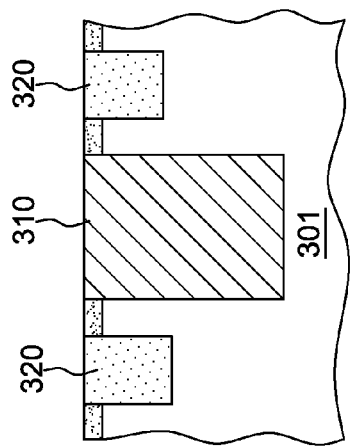
Figure 4D:
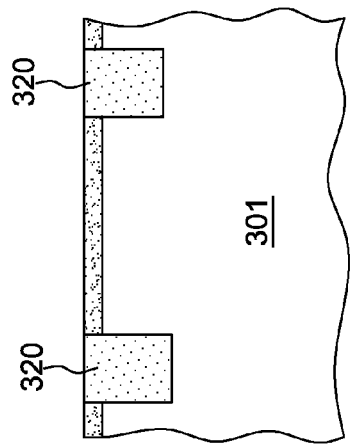

FIGS. 4A-4E depict one embodiment of a process for fabricating the structures disclosed herein. By way of example, FIG. 4A depicts an intermediate process structure, where a low-k dielectric material layer 400 is provided over substrate 301, and a photoresist layer 401 is disposed over low-k dielectric layer 400. In one example, the low-k dielectric material is a nitrogen-doped, low-k barrier material, such as nitrogen-doped silicon carbide (SiCN), which may have been deposited using plasma-enhanced CVD processing. The photoresist layer 401 is patterned and etched to produce openings 402 extending into substrate 301, as illustrated in FIG. 4B. A low-stress, thin-film fill 410 is provided over low-k dielectric layer 400 to fill openings 402 (FIG. 4B) in substrate 301, as illustrated in FIG. 4C. As noted above, the low-stress, thin-film fill has a low-elastic modulus, such as less than about 100 GPa, and low-hardness to absorb any thermal stress caused by a CTE mismatch of the TSV conductor and substrate materials. Materials such as polymer, plastic, organic or inorganic dielectric, porous dielectric material (such as porous glass), or a combination thereof, may be used for the stress buffers. Other types of materials may also be useful. After chemical-mechanical polishing, the structure of FIG. 4D is obtained, with stress buffers 320 defined from the low-stress, thin-film fill remaining within substrate 301. FIG. 4E depicts the resultant device after patterning of an opening and filling of the opening with an appropriate conductive material (such as copper, aluminum, tungsten, gold, silver, tin, or other metals, or alloys thereof) to device the TSV conductor 310, which with subsequent back-side polishing, will extend through the substrate.

As noted above, size and configuration of the discrete stress buffers disposed about an individual TSV conductor may vary as needed to achieve a desired, predefined stress-alleviation profile about the TSV conductor dependent, as noted, on whether the TSV conductor is part of an isolated TSV structure, a chained TSV structure, or an arrayed TSV structure (by way of example only). As a further variation, one of the stress buffers about a conductor may be an annular low-stress buffer surrounding and contacting the periphery of the individual TSV conductor. Such a configuration is described below with reference to FIGS. 5-7E.

Figure 5:
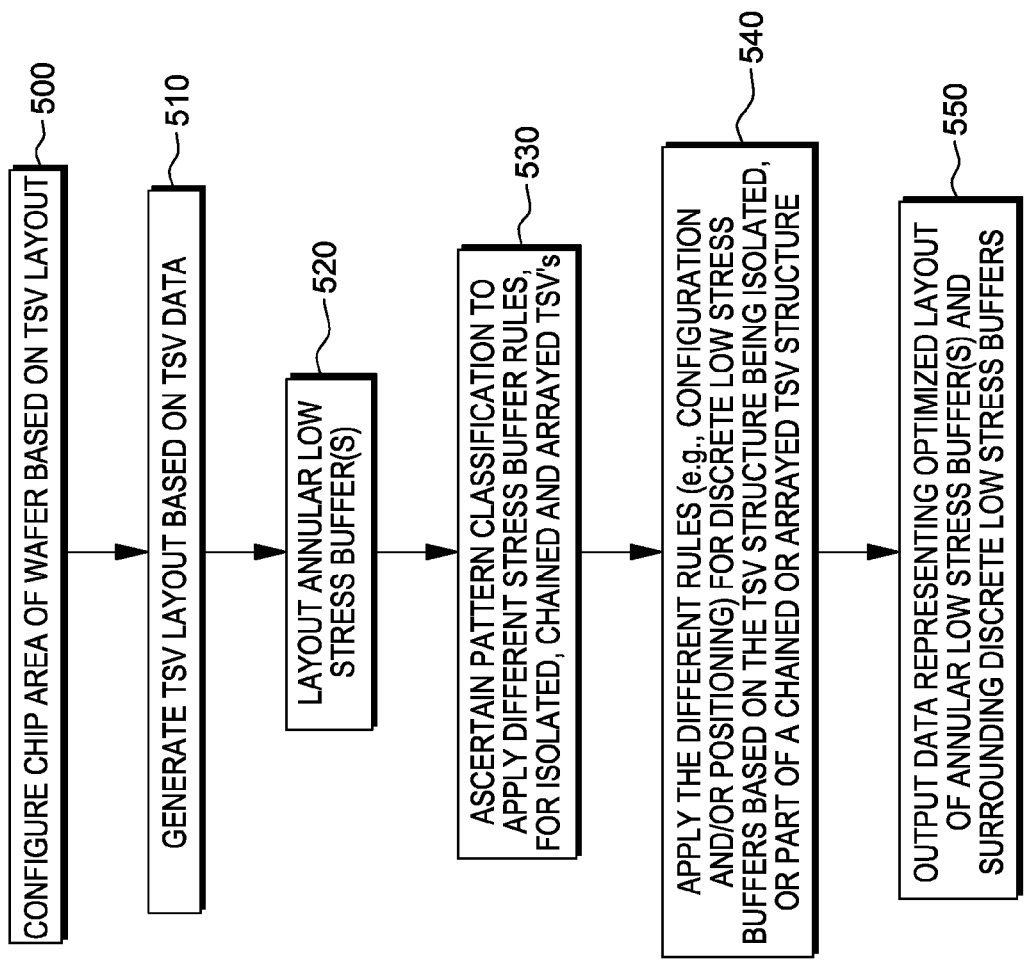
FIG. 5 depicts another embodiment of a process for facilitating forming a through-substrate via structure with multiple stress buffers, including an annular stress buffer, and a through-substrate via (TSV) conductor, in accordance with one or more aspects of the present invention.

FIG. 5 depicts one example of a process for ascertaining an optimized layout of stress buffers using predefined rules or configurations which employ an annular low-stress buffer and multiple discrete low-stress buffers. Processing configures the chip area of the wafer based on the desired TSV layout 500. This may include identifying TSV regions or areas within the chip or wafer. The TSV layout is generated based on the TSV data 510. An annular low-stress buffer layout is then obtained 520. As described herein, the annular low-stress buffer (or annular stress buffer) is a low-stress buffer material (such as referenced above) which encircles and contacts the periphery of selected individual TSV conductors. The pattern classification is ascertained to apply different stress buffer rules for laying out the discrete stress buffers about the individual TSV conductor based on whether the TSV conductor is part of an isolated TSV structure, a chained TSV structure, or an arrayed TSV structure 530. The different rules are then applied to ascertain the desired configuration and/or positioning for the discrete stress buffers based on the associated TSV structure being isolated, chained, or arrayed 540. Data is then output representing the optimized layout of the discrete low-stress buffers about the annular stress buffer 550, which may then be used in fabrication of one or more devices having one or more TSV structures with the optimized stress buffer layout.

Figure 6B:
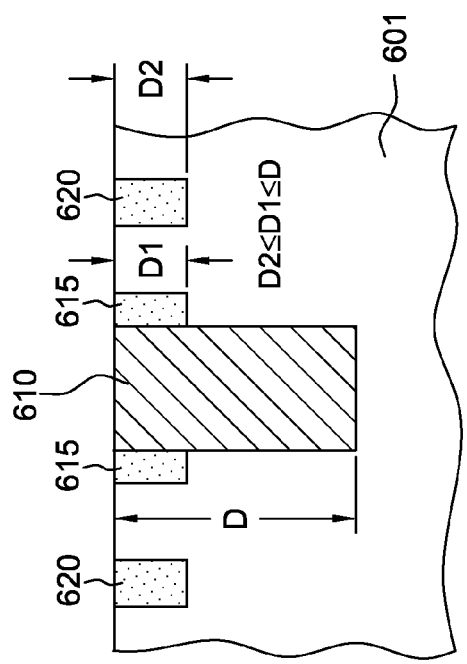
FIG. 6B is a cross-sectional elevational view of the structure of FIG. 6A, taken along line 6B-6B thereof, in accordance with one or more aspects of the present invention.
Figure 6A:
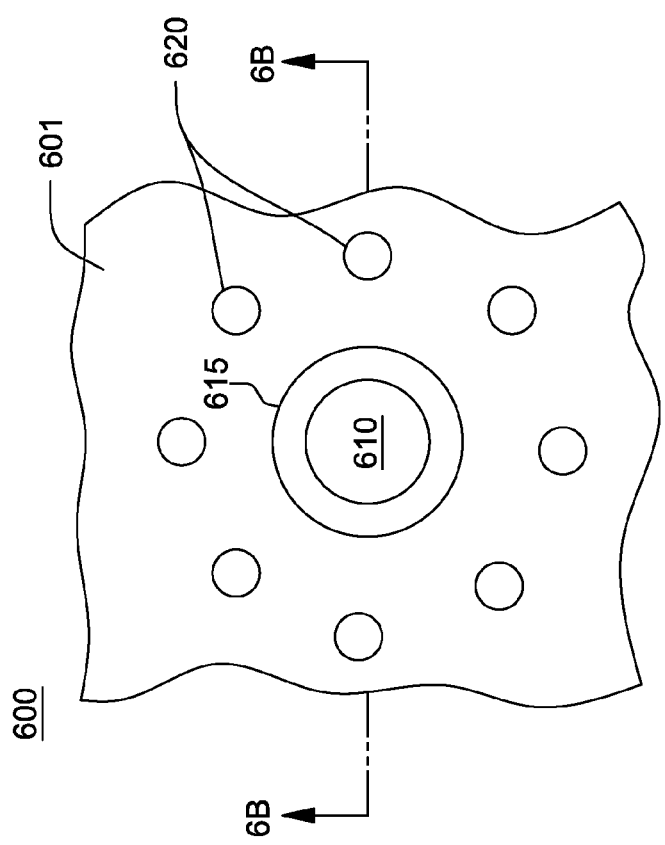
FIG. 6A is a partial plan view of another embodiment of an isolated through-substrate via (TSV) structure with an annular stress buffer about a TSV conductor and multiple discrete stress buffers disposed adjacent to the annular stress buffer, in accordance with one or more aspects of the present invention.

FIGS. 6A & 6B depict one embodiment of an isolated TSV structure 600 which includes a TSV conductor 610 formed within a substrate 601 and having an annular low-stress buffer 615 surrounding the periphery thereof, and multiple discrete stress buffers 620 arrayed about TSV conductor 610 in spaced relation to annular stress buffer 615. In one example, annular stress buffer 615 and discrete stress buffers 620 are fabricated of a same material and extend a depth D1, D2, respectively, into substrate 601 with, for instance, D2 being less than or equal to D1. In the implementation illustrated, the depth (D) of TSV conductor 610 is shown to be greater than that of the annular stress buffer 615 and discrete stress buffers 620 (by way of example only). Again, FIGS. 6A & 6B depict one example of a predefined rule for laying out stress buffers 615, 620 when the TSV structure being fabricated is an isolated TSV structure. Advantageously, the multiple discrete stress buffers 620 about the annular stress buffer 615 further benefit the low-stress film performance of the annular buffer, and further reduce the stress affect on any nearby or adjacent components or devices in the chip or wafer.

Note that the size of the annular stress buffer and the size of the discrete stress buffers may be predefined to achieve the desired stress reduction. Process savings may be obtained by using the same size and shape stress buffers for the discrete stress buffers. Further, the TSV conductor and annular stress buffer may have the same or similar shapes. Providing the TSV conductor and annular stress buffer with the same shape advantageously enables the use of the same reticle to form both the annular stress buffer and the TSV conductor. The same reticle may be used with different CD printing to form the annular stress buffer and the TSV conductor. For example, the reticle may print with larger CD for the annular stress buffer, and smaller CD for the TSV conductor. This may be used to form the TSV conductor concentrically with the annular stress buffer. The use of more than one reticle, such as two reticles, for forming the TSV conductor and annular stress buffer may also be useful. In other embodiments, the annular stress buffer and TSV conductor may include different shapes. The diameter of the TSV conductor may range, for example, from about 1 μm to 10 μm.

Figure 6C:
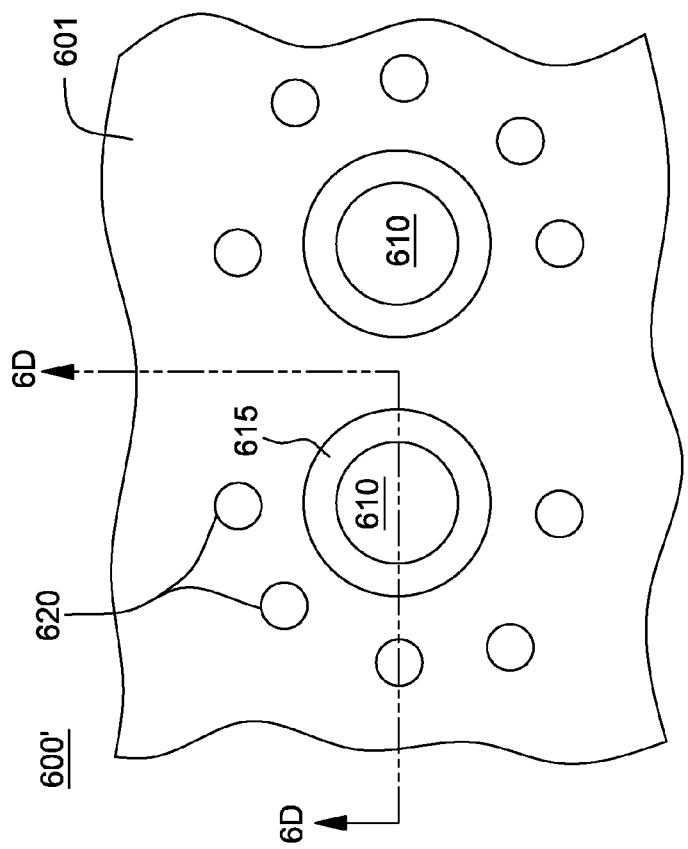
FIG. 6C is a top plan view of another embodiment of a chained TSV structure with annular stress buffers disposed about the individual TSV conductors and multiple discrete stress buffers disposed about the annular stress buffers, in accordance with one or more aspects of the present invention.
Figure 6D:
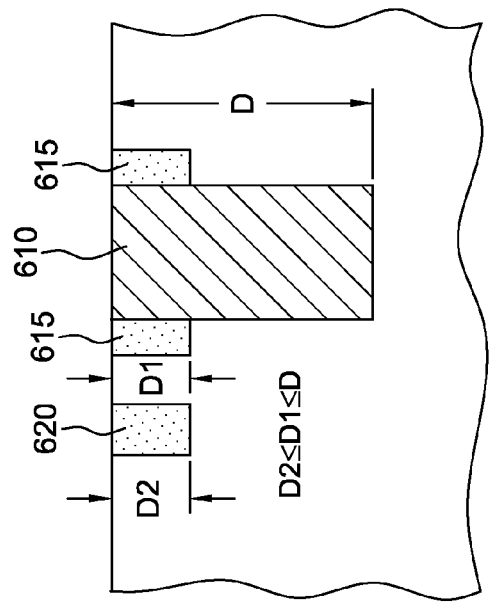
FIG. 6D depicts a cross-sectional elevational view of the structure of FIG. 6C, taken along line 6D-6D thereof, in accordance with one or more aspects of the present invention.

FIGS. 6C & 6D depict one example of a rule for laying out an annular stress buffer 615 and multiple discrete stress buffers 620 when the individual TSV conductor 610 is part of a chained TSV structure 600'. As illustrated, when the individual TSV conductor 610 is part of a chained TSV structure, then selected discrete stress buffers 620 may be omitted as unnecessary to achieving the desired minimization of stress emanating from structure 600'. As in the example of FIGS. 6A & 6B, the discrete low-stress buffers 620 arrayed about the annular stress buffer 615 in FIGS. 6C & 6D further reduce the stress affect on any nearby components or devices, and provide a benefit to the performance of the annular low-stress film layer. In one embodiment, the depth D2 of the discrete stress buffers 620 is less than or equal to the depth D1 of the annular stress buffer 615, which may be less than or equal to the depth (D) of the TSV conductor 610. In one embodiment, materials and relative sizes may be similar to those described above.

Figure 6F:
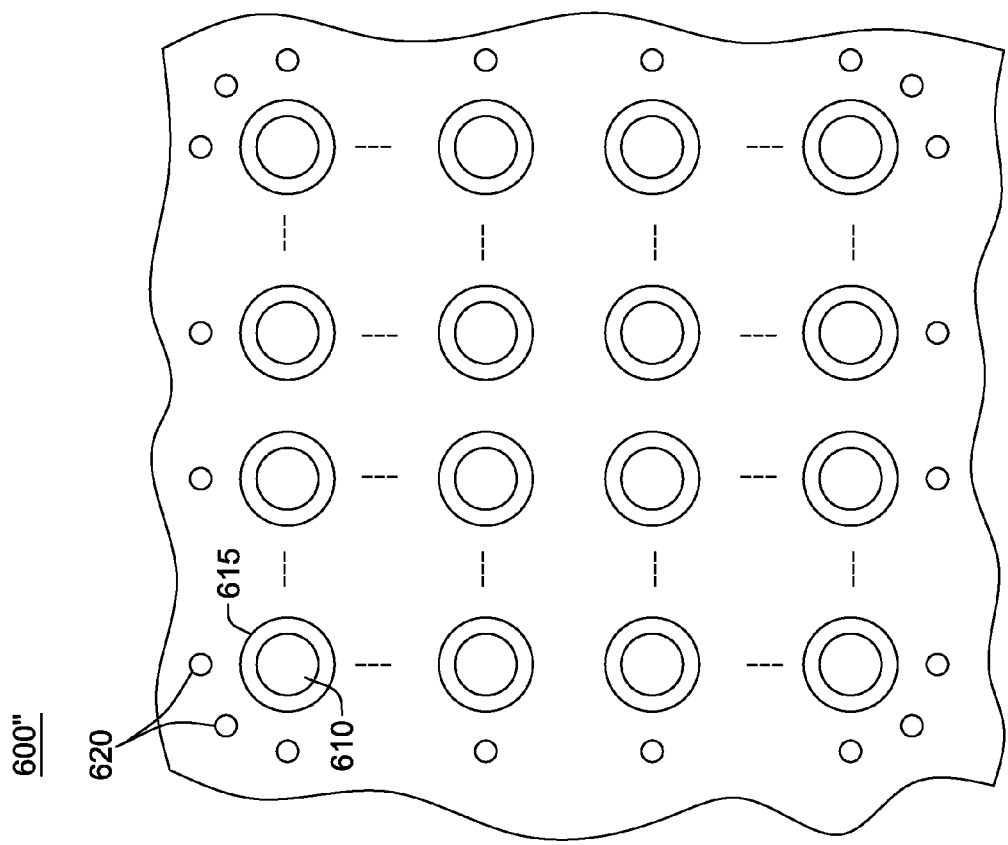
FIG. 6F depicts a variation on the structure of FIG. 6E, where the 2×2 arrayed TSV structure of FIG. 3B is expanded to an n×n arrayed TSV structure, in accordance with one or more aspects of the present invention.
Figure 6E:
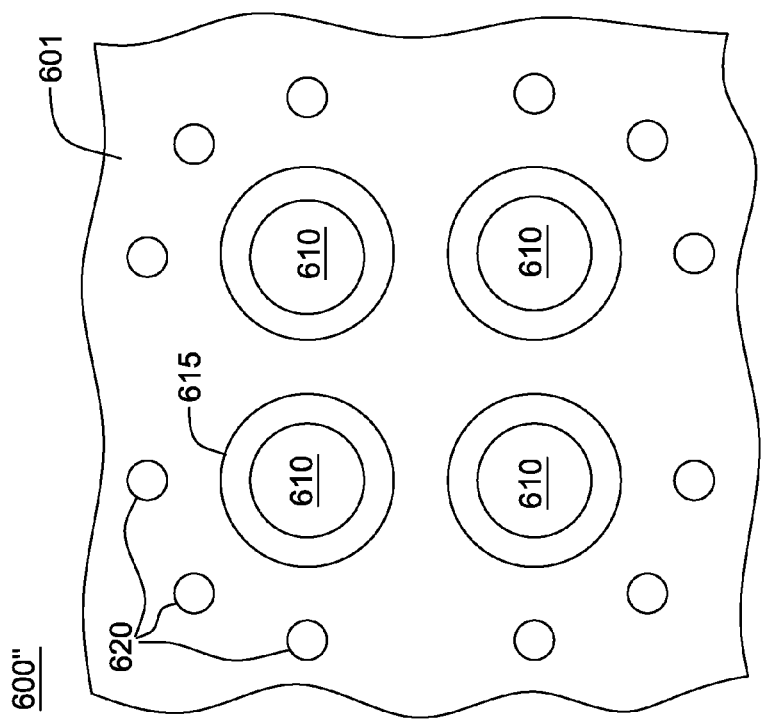
FIG. 6E is a partial plan view of another embodiment of a 2×2 arrayed TSV structure with four TSV conductors, and corresponding annular stress buffers and multiple discrete stress buffers arrayed about the individual TSV conductors, in accordance with one or more aspects of the present invention.

FIGS. 6E & 6F depict embodiments of arrayed TSV structures 600", including a 2×2 arrayed TSV structure, and an n×n arrayed TSV structure, respectively. In these configurations, the discrete stress buffers 620 are provided for the individual TSV conductors 610 disposed at the periphery of the arrayed TSV structure to further enhance stress reduction compared with an annular stress buffer 615 approach only. That is, the additional discrete stress buffers 620 benefit the annular low-stress film performance, and further reduce the stress affect on any nearby components or devices. Sizes and materials of the discrete stress buffers 620, annular stress buffers 615, and TSV conductors 610 may be as discussed above in connection with the examples of FIGS. 6A-6D.

Figure 7A:
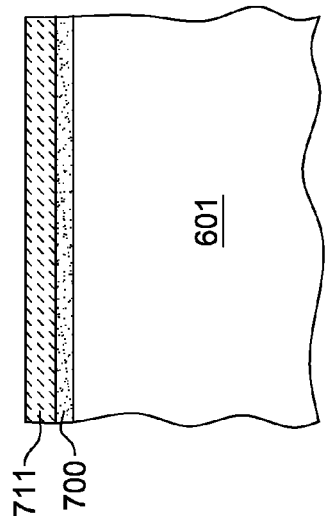
FIGS. 7A-7E depict one embodiment of a process for fabricating a through-substrate via structure such as depicted in FIGS. 6A-6F, in accordance with one or more aspects of the present invention.
Figure 7B:
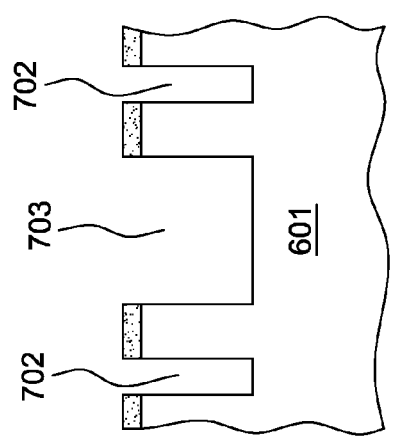
Figure 7C:
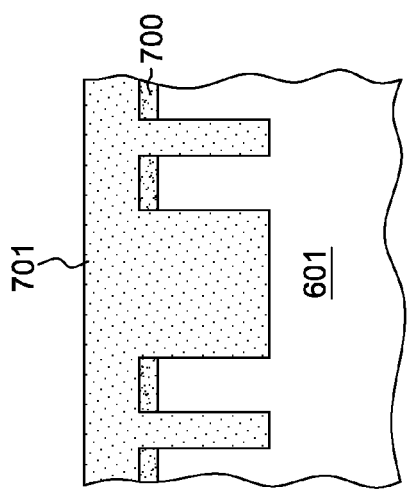
Figure 7D:
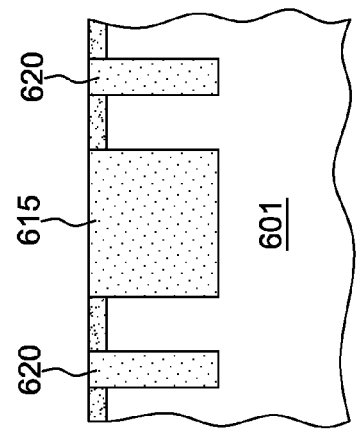
Figure 7E:
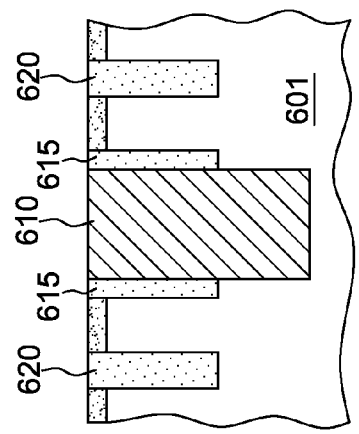

FIGS. 7A-7E depict one example of a process for producing the structures described above in connection with FIGS. 6A-6F. By way of example, FIG. 7A depicts an intermediate structure which includes a substrate 601 with a low-k dielectric material layer 700 and photoresist layer 711 disposed over a main surface thereof. The photoresist layer 711 is patterned and etched to define openings 702, 703 within substrate 601, as illustrated in FIG. 7B. Note that opening 703 has a larger diameter and is sized to accommodate the annular stress buffer 615 and the TSV conductor 610 (see FIG. 7E). Openings 702 are located and sized to accommodate the discrete stress buffers 620 (see FIG. 7D). An appropriate low stress buffer material 701 is provided, filling openings 702, 703 and overlying the intermediate structure, as shown in FIG. 7C. After chemical-mechanical polishing, the structure of FIG. 7D is obtained, with annular stress buffer 615 disposed within opening 703 (FIG. 7B) and discrete stress buffers 620 filling openings 702 (see FIG. 7B). TSV conductor formation may then proceed by further patterning the structure of FIG. 7D to facilitate providing an opening into material 615 and substrate 601 to allow defining the TSV conductor 610, as illustrated in FIG. 7E. This conductor is provided to extend through annular stress buffer 615, thereby defining the annular nature of the stress buffer 615 about the periphery of TSV conductor 610. See, in this regard, the plan views of FIGS. 6A, 6C, 6E & 6F.

Those skilled in the art will note that the particular discrete stress buffer layout depends upon the type of TSV structure, as well as the location of the individual TSV conductor within, for instance, a chained TSV structure or an arrayed TSV structure. Differently sized discrete stress buffers may also be provided about the annular stress buffer, with the stress distribution about the TSV structure being further reduced or eliminated by the use of discrete stress buffers in combination with the annular stress buffer about the periphery of the TSV conductor. The additional, discrete low-stress buffer filling patterns can improve performance (including lithography, etching, and CMP dishing) of the annular low-stress filled regions for each of the TSV structure implementations described herein. Note again, in the process flow of FIG. 5, pattern classification is used to obtain a predefined optimize layout of the additional, discrete stress buffers about the TSV conductor and annular stress buffer.

Figure 8B:
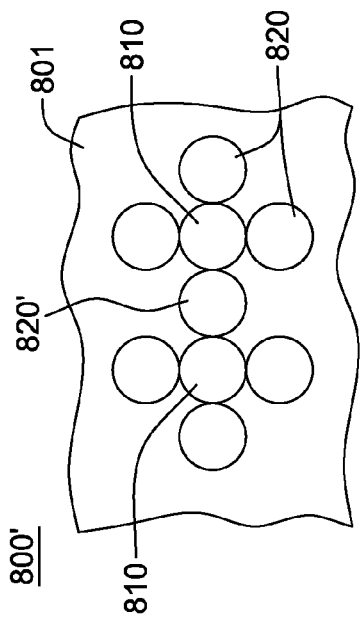
FIG. 8B is a top plan view of a further embodiment of a chained TSV structure with multiple stress buffers contacting the individual TSV conductors thereof, in accordance with one or more aspects of the present invention.
Figure 8C:
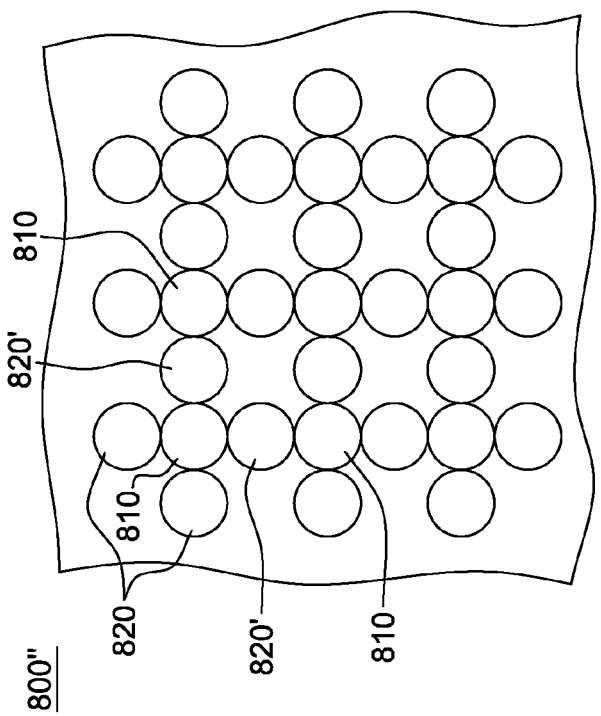
FIG. 8C is a partial plan view of a further embodiment of an n×n arrayed TSV structure with multiple stress buffers in contact with the individual TSV conductors, and with at least some stress buffers contacting two TSV conductors, in accordance with one or more aspects of the present invention.
Figure 8A:
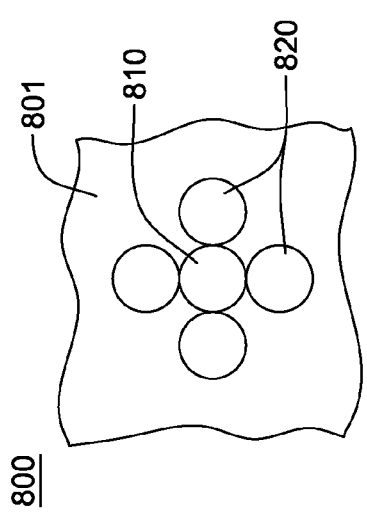
FIG. 8A is a partial plan view of a further embodiment of an isolated TSV structure with multiple stress buffers contacting the TSV conductor, in accordance with one or more aspects of the present invention.

FIGS. 8A-8B depict a further variation on the stress buffer configurations disclosed herein. In particular, FIG. 8A depicts one embodiment of an isolated TSV structure 800, wherein a TSV conductor 810 is provided with multiple discrete stress buffers 820 in contact the periphery thereof along, for instance, an X and Y axis, to reduce normal stresses emanating from the TSV conductor 810. In this implementation, the diameter of the discrete stress buffers 820 is shown to be substantially equal to the diameter of the TSV conductor 810, by way of example only. Other configurations and sizes for the stress buffers 820 may be useful.

FIG. 8B depicts an example of a chained TSV structure 800', where two TSV conductors 810 are provided within substrate 801 closely positioned so as to form the chained TSV structure. In this embodiment, the discrete stress buffers 820 are similar to those illustrated in FIG. 8A, and one of the stress buffers 820' is a shared stress buffer contacting both of the individual TSV conductors 810. Note that this shared stress buffer 820' configuration is presented by way of example only.

In FIG. 8C, an arrayed TSV structure 800" is depicted, which includes (by way of example) a 3×3 array of individual TSV conductors 810, and surrounding stress buffers 820, 820'. As in the example of FIG. 8B, stress buffers 820' are shared stress buffers which facilitate minimizing stress distribution from two adjacent TSV conductors 810 in the 3×3 arrayed TSV structure. By way of example, these shared stress buffers 820' contact the peripheries of multiple TSV conductors.

The low-stress film material(s) of stress buffers 820, 820' may be any of the above-described low-stress materials, with the particular low-stress filling pattern being based on the different TSV-originating stress distributions of the individual TSV conductors dependent on the structure being an isolated TSV structure, a chained TSV structure, or an arrayed TSV structure. The different stress buffer layout rules or configurations are predefined (for instance, by empirical or modeled analysis) as discussed herein.

Figure 9B:
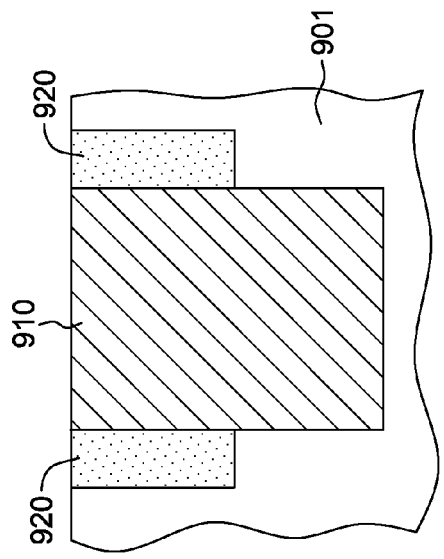
FIG. 9B depicts a cross-sectional elevational view of the structure of FIG. 9A, taken along line 9B-9B thereof, in accordance with one or more aspects of the present invention.
Figure 9D:
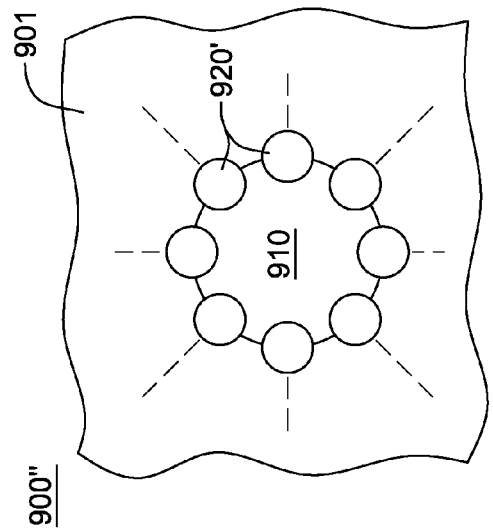
FIG. 9D depicts another variation on the isolated TSV structure of FIG. 9A, wherein the multiple stress buffers overlay, in part, the TSV conductor, in accordance with one or more aspects of the present invention.
Figure 9A:
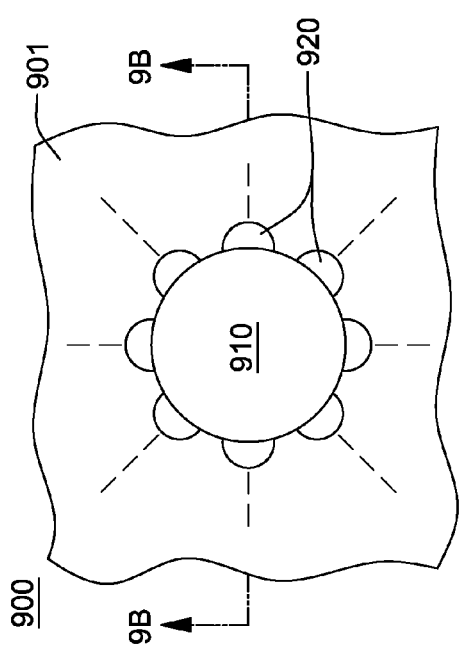
FIG. 9A is a partial plan view of another embodiment of an isolated through-substrate via (TSV) structure with multiple stress buffers contacting the periphery of the TSV conductor, in accordance with one or more aspects of the present invention.

FIGS. 9A & 9B depict a further example of an isolated TSV structure 900, which includes a through-substrate via (TSV) conductor 910 and multiple stress buffers 920 arrayed about the periphery of TSV conductor 910. In this embodiment, the depth of the individual stress buffers 920 may be less than the depth of the TSV conductor 910, as illustrated in FIG. 9B, and the materials and relative proportions may be similar to those described above. However, note that in this configuration, rather than having a circular structure, the individual stress buffers are defined with a semi-spherical shape and are located to protrude from the periphery of the TSV conductor 910, as shown.

Figure 9C:
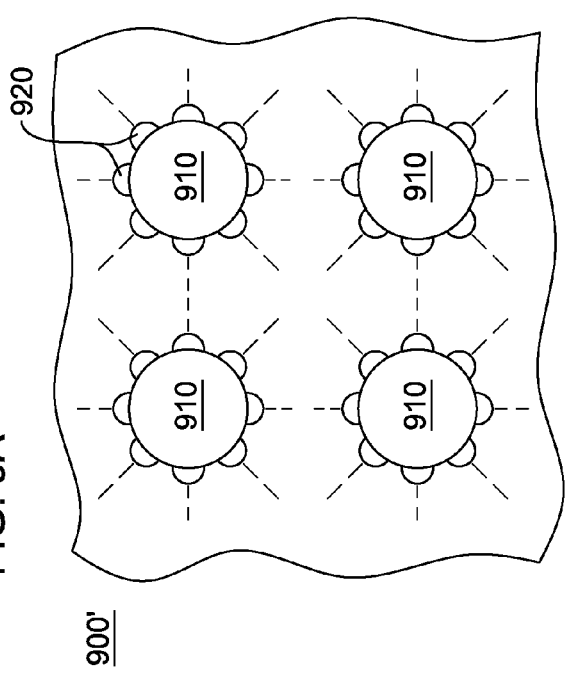
FIG. 9C is a partial plan view of another embodiment of a 2×2 arrayed TSV structure with multiple stress buffers arrayed about the peripheries of the four TSV conductors, in accordance with one or more aspects of the present invention.

FIG. 9C illustrates an arrayed TSV structure 900', which includes a 2×2 array of TSV conductors 910 densely placed in close proximity, each with multiple discrete stress buffers 920 disposed at or protruding from a periphery thereof, as in the example of FIGS. 9A & 9B.

Note that in the examples of FIGS. 9A-9C, the stress buffers 920 are placed or located to alleviate any normal stress and shear stress that may result from a CTE mismatch between the respective TSV conductor and the substrate material.

FIG. 9D depicts a variation on the configuration of FIGS. 9A & 9B. In this isolated TSV structure 900'', the multiple discrete stress buffers 920' are again provided about the periphery of TSV conductor 910 to alleviate both normal and shear stresses. However, in this example, the multiple discrete stress buffers overlie 920' at least partially and extend into the TSV conductor 910, as illustrated. As one example, the configuration of FIG. 9D may be obtained by first forming TSV conductor 910 within substrate 901, and thereafter, forming the multiple discrete stress buffers 920' by patterning appropriately sized openings within or about the periphery of TSV conductor 910, filling the openings with an appropriate stress buffering film, and polishing the film to achieve the desired structure illustrated.

Figure 9E:
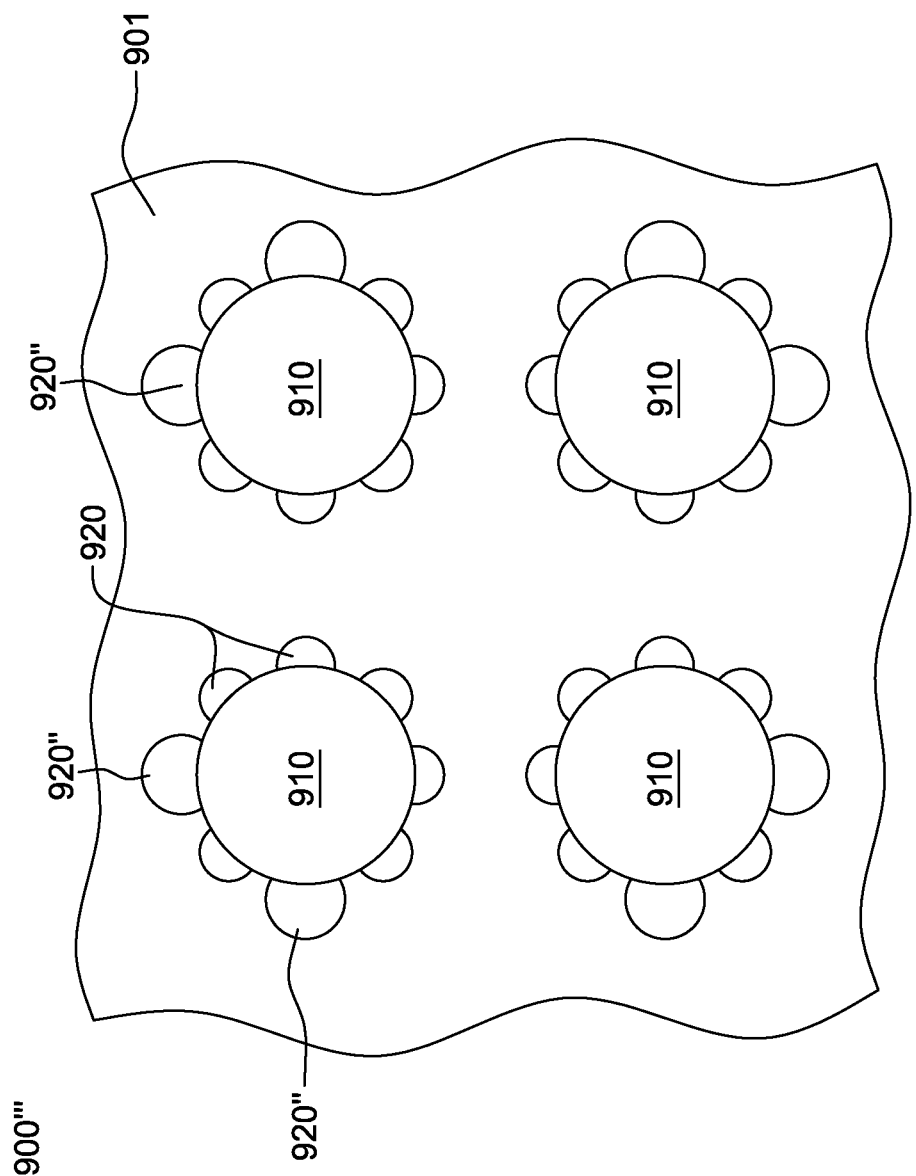
FIG. 9E depicts another variation on the arrayed TSV structure of FIG. 9C, wherein one or more stress buffers in contact with the periphery of the respective TSV conductor are differently sized or configured from other stress buffers in contact with the periphery of the TSV conductor, in accordance with one or more aspects of the present invention.

FIG. 9E depicts a further variation on the structure of FIG. 9C, wherein an arrayed TSV structure 900''' is presented having selected stress buffers 920'' with a different configuration and/or size from other stress buffers 920 disposed about the peripheries of the individual TSV conductors 910. In this 2×2 arrayed TSV structure example, the larger stress buffers 920'' are disposed to facilitate reducing normal stress emanating outward from the corners of the 2×2 arrayed TSV structure 900'''. Note that the configuration and size of the individual discrete stress buffers may be predefined in order to best mitigate the stress impact on surrounding features, based on whether the TSV structure at issue is an isolated TSV structure, a chained TSV structure, or an arrayed TSV structure.

Figure 10A:
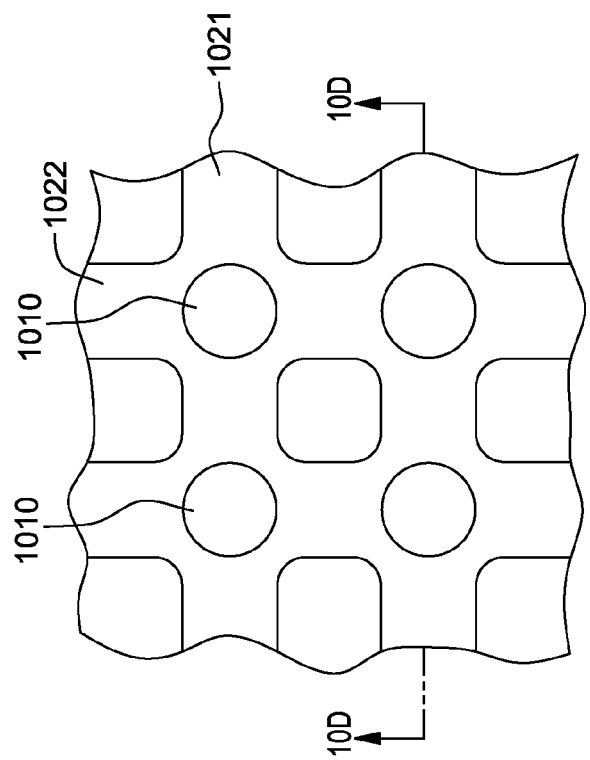
FIG. 10A is a partial plan view of one embodiment of a device or wafer which includes a stress buffer trench grid provided therein, in accordance with one or more aspects of the present invention.
Figure 10B:
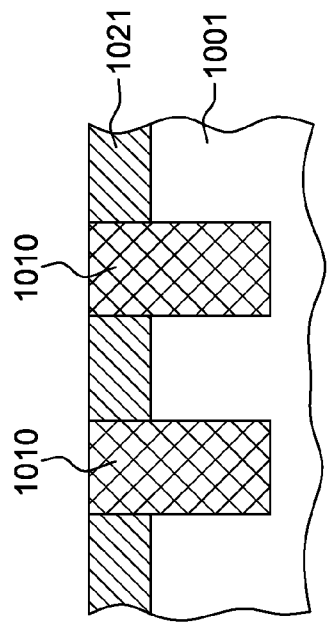
FIG. 10B depicts a cross-sectional elevational view of the device of FIG. 10A, taken along line 10B-10B thereof, in accordance with one or more aspects of the present invention.
Figure 10C:
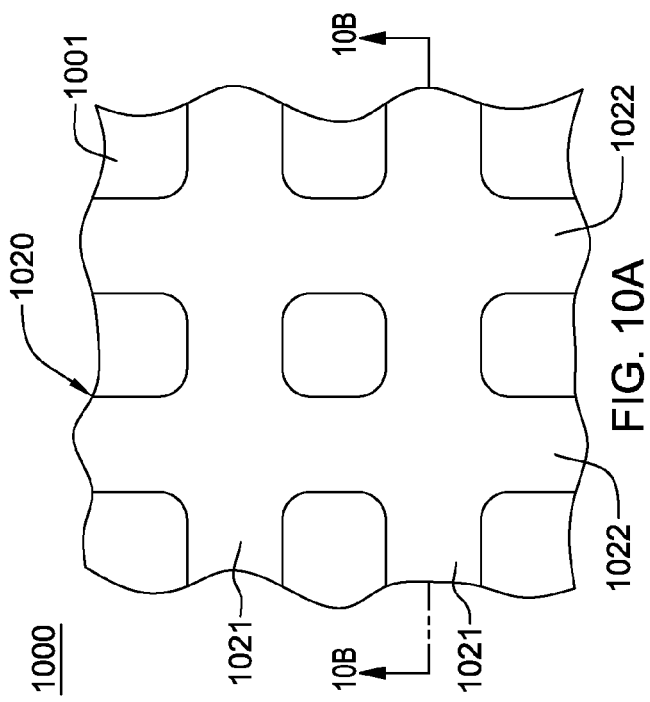
FIG. 10C depicts the device of FIG. 10A after provision of TSV conductors extending through the stress buffer trench grid, in accordance with one or more aspects of the present invention.
Figure 10D:
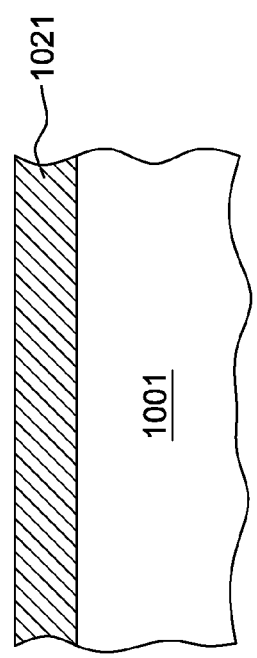
FIG. 10D depicts a cross-sectional elevational view of the device of FIG. 10C, taken along line 10D-10D thereof, in accordance with one or more aspects of the present invention.

FIGS. 10A-10D depict a further variation on the concepts presented herein, wherein a structure 1000 is provided which includes a stress buffer trench grid 1020 formed within a substrate 1001. In one embodiment, the trench grid may be defined by multiple intersecting, linearly-extending stress buffer trenches 1021, 1022 defined within the substrate. The illustrated stress buffer trench grid 1020 is particularly advantageous in a dense or an arrayed TSV structure configuration. In particular, FIGS. 10C & 10D depict a 2×2 arrayed TSV structure, wherein TSV conductors 1010 are provided at the intersections of the linear stress buffer trenches 1021, 1022 formed within the substrate. As illustrated in FIG. 10D, in one implementation, the stress buffer trench 1021, 1022 depth is less than the depth of the individual TSV conductors 1010, and may have depths similar to those described above. As with the stress buffer embodiments described above, the stress buffer trench grid embodiment facilitates reducing or eliminating stress emanating from the TSV conductors, for instance, in the TSV region of the chip or wafer, to other components or devices within the chip or wafer.

Figure 11:
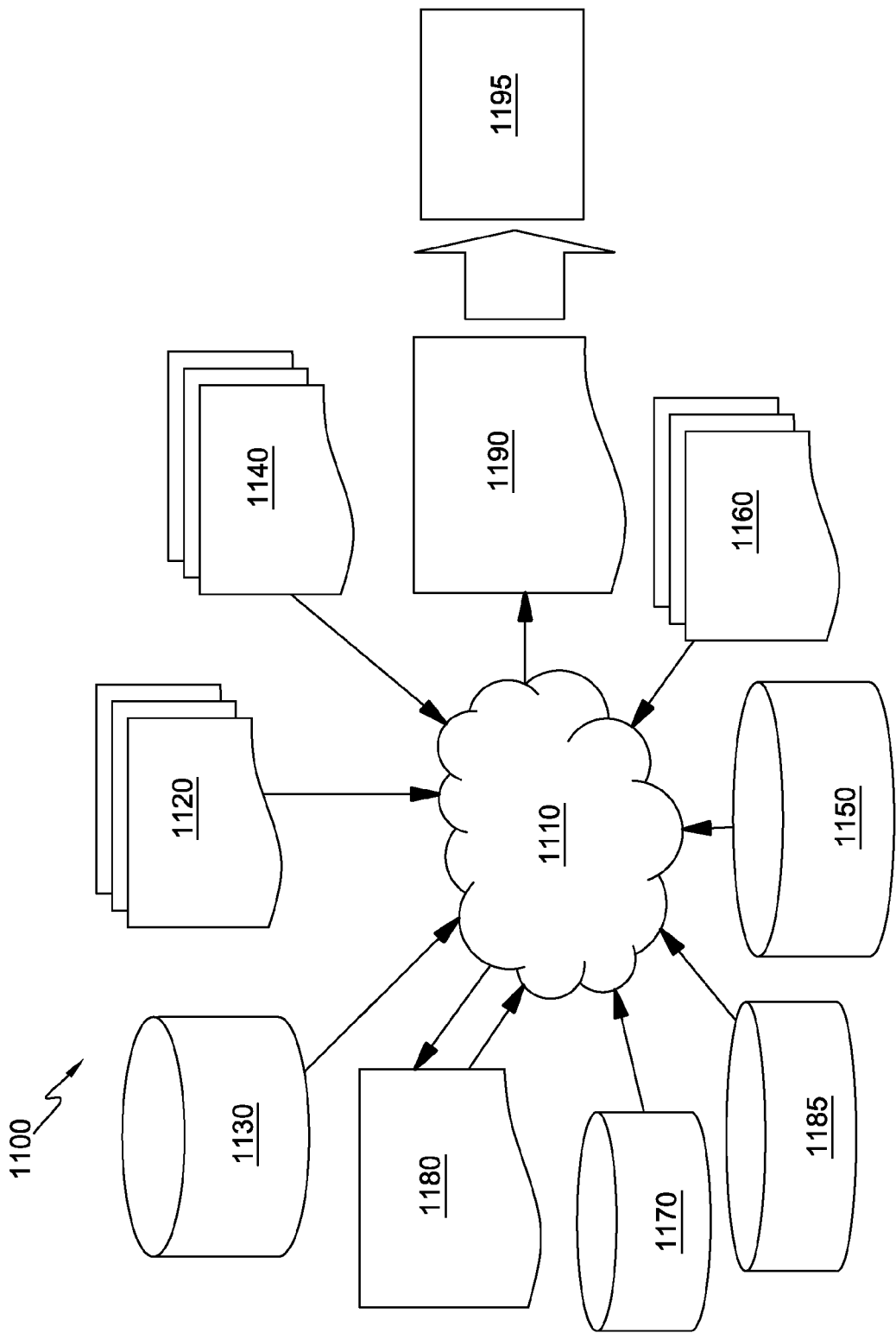
FIG. 11 depicts one embodiment of a flow diagram of a design process which may be employed in semiconductor design and manufacture of semiconductor structures, in accordance with one or more aspects of the present invention.

FIG. 11 depicts a block diagram of an exemplary design flow 1100 used, for example, in semiconductor circuit design, simulation, test, layout, and manufacture. Design flow 1100 includes processes and mechanisms for processing design structures or devices to generate logically or otherwise functionally-equivalent representations of the processes, design structures and/or devices described above and shown in FIGS. 1-10D. The design structures and/or processes generated by design flow 1100 may be encoded on machine-readable transmission or storage media to include data and/or instructions that, when executed or otherwise processed on a data processing system, generate a logically, structurally, mechanically, or otherwise functionally-equivalent representation of hardware components, circuits, devices, or systems. Design flow 1100 may vary, depending on the type of representation being designed. For example, a design flow for building an application specific integrated circuit (ASIC) may differ from a design flow for designing a standard component, or from a design flow for instantiating the design into a programmable array, for example, a programmable gate array (PGA) or field programmable gate array (FPGA) offered by Altera®, Inc., or Xilinx®, Inc.

FIG. 11 illustrates multiple such design structures, including an input design structure 1120 that is processed by a design process 1110. Design structure 1120 may be a logical simulation design structure, generated and processed by design process 1110 to produce a logically, equivalent-functional representation of a hardware device. Design structure 1120 may also, or alternately, comprise data and/or program instructions that, when processed by design process 1110, generate a functional representation of the physical structure of a hardware device. Whether representing functional and/or structural design features, design structure 1120 may be generated using electronic computer-aided design (ECAD), such as implemented by a core developer/designer. When encoded on a machine-readable data transmission, gate array, or storage medium, design structure 1120 may be accessed and processed by one or more hardware and/or software modules within design process 1110 to simulate or otherwise functionally represent an electronic component, circuit, electronic or logic module, apparatus, device or system, such as those shown in FIGS. 1-10D. As such, design structure 1120 may comprise files or other data structures, including human and/or machine-readable source code, compiled structures, and computer-executable code structures that, when processed by a design or simulation data processing system, functionally simulate or otherwise represent circuits or other levels of hardware logic design. Such data structures may include hardware-description language (HDL), design entities, or other data structures conforming to and/or compatible with lower-level HDL design languages, such as Verilog and VHDL, and/or higher-level design languages, such as C or C++.

Design process 1110 may employ and incorporate hardware and/or software modules for synthesizing, translating, or otherwise processing a design/simulation functional equivalent of the components, circuits, devices or logic structures shown in FIGS. 1-10D to generate a netlist 1180, which may contain design structures, such as design structure 1120. Netlist 1180 may comprise, for example, compiled or otherwise processed data structures representing a list of wires, discrete components, logic gates, control circuits, I/O devices, models, etc. that describes the connections to other elements and circuits in an integrated circuit design. Netlist 1180 may be synthesized using an interactive process in which netlist 1180 is re-synthesized one or more times, depending on design specifications and parameters for the device. As with other design structure types described herein, netlist 1180 may be recorded on a machine-readable data storage medium, or programmed into a programmable gate array. The medium may be a non-volatile storage medium, such as a magnetic or optical disk drive, a programmable gate array, a compact flash, or other flash memory. Additionally, or in the alternative, the medium may be a system cache memory, buffer space, or electrically or optically conductive devices and materials on which data packets may be transmitted and intermediately stored via the Internet, or other networking suitable means.

Design process 1110 may include hardware and software modules for processing a variety of input data structure types, including netlist 1180. Such data structure types may reside, for example, within library elements 1130 and include a set of commonly used elements, circuits, and devices, including modules, layouts, and symbolic representations, for a given manufacturing technology (e.g., different technology nodes, 32 nm, 45 nm, etc.). The data structure types may further include design specifications 1140, characterization data 1150, verification data 1160, design rules 1170, and test data files 1185, which may include input test patterns, output test results, and other testing information. Design process 1110 may further include, for example, standard mechanical design processes, such as stress analysis, thermal analysis, mechanical event simulation, process simulations for operations, such as casting, molding, and die press forming, etc. One of ordinary skill in the art of mechanical design can appreciate the extent of possible mechanical design tools and applications used in design process 1110, without deviating from the scope and spirit of the invention. Design process 1110 may also include modules for performing standard circuit design processes, such as timing analysis, verification, design rule checking, place and route operations, etc.

Design process 1110 employs and incorporates logical and physical design tools, such as HDL, compilers and simulation module build tools to process design structure 1120 together with some or all of the depicted supporting data structures, along with any additional mechanical design of data (if applicable), to generate a second design structure 1190. Design structure 1190 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1120, design structure 1190 may comprise one or more files, data structures, or other computer-encoded data or instructions that reside on transmission or data storage media, and that when processed by an ECAD system, generate a logically or otherwise functionally-equivalent form of one or more of the embodiments of the invention. In one embodiment, design structure 1190 may comprise a compiled, executable HDL simulation model that functionally simulates the processes and devices shown in FIGS. 1-10D.

Design structure 1190 may also employ a data format used for the exchange of layout data of integrated circuits and/or symbolic data format (e.g., information stored in a GDSII (GDS2), GL1, OASIS, map files, or any other suitable format for storing such design data structures). Design structure 1190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures, such as described above and shown in FIGS. 1-10D. Design structure 1190 may then proceed to stage 1195, where, for example, design structure 1190 proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have"

(and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    facilitating forming a through-substrate via (TSV) structure, the facilitating forming comprising:
        predefining: a first configuration of stress buffers about a through-substrate via conductor where the through-substrate via conductor is part of an isolated through-substrate via structure; a second configuration of stress buffers about the through-substrate via conductor where the through-substrate via conductor is part of a chained through-substrate via structure; and a third configuration of stress buffers about the through-substrate via conductor where the through-substrate via conductor is part of an arrayed through-substrate via structure; wherein the first configuration, the second configuration, and the third configuration are different predefined configurations of stress buffers about the through-substrate via conductor, and the second configuration of stress buffers is the same as the first configuration of stress buffers, less one or more stress buffers of the first configuration, and the third configuration of stress buffers is the same as the second configuration of stress buffers, less one or more stress buffers of the second configuration;
        determining for a through-substrate via conductor to be provided whether the through-substrate via conductor is in the isolated through-substrate via structure, the chained through-substrate via structure, or the arrayed through-substrate via structure
        providing the through-substrate via conductor within a substrate; and
        forming multiple stress buffers within the substrate, the multiple stress buffers being disposed in spaced relation about the through-substrate via conductor in one of the first configuration, the second configuration, or the third configuration, based on whether the through-substrate via conductor is determined to be in the isolated through-substrate via structure, the chained through-substrate via structure, or the arrayed through-substrate via structure, respectively.

2. The method of claim 1, wherein the multiple stress buffers are, at least in part, uniformly spaced about the through-substrate via conductor.

3. The method of claim 2, wherein the through-substrate via structure is the isolated through-substrate via structure and the multiple stress buffers in the first configuration are spaced separate from and arrayed about the through-substrate via conductor along a common radius extending from a center of the through-substrate via conductor.

4. The method of claim 2, wherein the multiple stress buffers are in contact with the through-substrate via conductor at a periphery thereof.

5. The method of claim 4, wherein at least two stress buffers of the multiple stress buffers in contact with the through-substrate via conductor are differently configured or sized.

6. The method of claim 1, wherein the multiple stress buffers are, at least in part, non-uniformly spaced about the through-substrate via conductor.

7. The method of claim 1, wherein the multiple stress buffers are spaced separate from the through-substrate via conductor along a common radius out from a center of the through-substrate via conductor.

8. The method of claim a 1, wherein at least two stress buffers of the multiple stress buffers are differently sized.

9. The method of claim 1, wherein at least two stress buffers of the multiple stress buffers are differently configured.

10. The method of claim 1, wherein at least one stress buffer of the multiple stress buffers is in contact with the through-substrate via conductor.

11. The method of claim 10, wherein the at least one stress buffer of the multiple stress buffers comprises an annular stress buffer surrounding the through-substrate via conductor.

12. The method of claim 11, wherein forming the multiple stress buffers comprises providing a plurality of discrete stress buffers spaced from the annular stress buffer surrounding the through-substrate via conductor.

13. The method of claim 12, wherein the through-substrate via structure comprises one of the chained through-substrate via structure or the arrayed through-substrate via structure, and forming the multiple stress buffers comprises locating the plurality of discrete stress buffers according to a location of the through-substrate via conductor within the chained through-substrate via structure or the arrayed through-substrate via structure, and wherein at least two different through-substrate via locations within the chained through-substrate via structure or the arrayed through-substrate via structure comprise different patterns of the plurality of discrete stress buffers about the respective annular stress buffer.

14. The method of claim 1, wherein the through-substrate via conductor comprises one of the chained through-substrate via structure or the arrayed through-substrate via structure, and forming the multiple discrete stress buffers comprises providing at least one stress buffer shared by the through-substrate via conductor and an adjacent through-substrate via conductor in the chained through-substrate via structure or the arrayed through-substrate via structure.

15. The method of claim 1, wherein the through-substrate via structure comprises the arrayed through-substrate via structure, and forming the at least one stress buffer comprises forming a stress buffer trench within the substrate, the through-substrate via conductor passing through the stress buffer trench in the substrate.

16. The method of claim 1, wherein the through-substrate via structure comprises the arrayed through-substrate via structure, and forming the at least one stress buffer comprises forming a stress buffer trench grid within the substrate, the through-substrate via conductor passing through the stress buffer trench grid into the substrate at an intersection of stress buffer trenches of the stress buffer trench grid.

17. The method of claim 1, wherein the multiple stress buffers only partially encircle the through-substrate via conductor.

\* \* \* \* \*